(12) United States Patent
Martines et al.

(10) Patent No.: US 7,450,428 B2
(45) Date of Patent: Nov. 11, 2008

(54) READING CIRCUIT AND METHOD FOR A NONVOLATILE MEMORY DEVICE

(76) Inventors: Ignazio Martines, Via Mario Rapisardi, 9b, 95030 Tremestieri Etneo (IT); Michele La Placa, Via Filippo Juvarra, 1, 90015 Cefalu' (IT)

( * ) Notice: Subject to any disclaimer, the term of this patent is extended or adjusted under 35 U.S.C. 154(b) by 0 days.

(21) Appl. No.: 11/811,394

(22) Filed: Jun. 8, 2007

(65) Prior Publication Data

US 2007/0247903 A1 Oct. 25, 2007

Related U.S. Application Data

(63) Continuation of application No. 11/238,137, filed on Sep. 28, 2005, now Pat. No. 7,242,619.

(30) Foreign Application Priority Data

Sep. 28, 2004 (EP) .................................. 04425724

(51) Int. Cl.
    *G11C 11/34* (2006.01)
(52) U.S. Cl. ................. 365/185.2; 365/210; 365/189.07
(58) Field of Classification Search .............. 365/185.2, 365/145, 149, 210, 189.09, 185.03, 185.15, 365/185.19, 189.07, 45
    See application file for complete search history.

(56) References Cited

U.S. PATENT DOCUMENTS

| | | | | |
|---|---|---|---|---|
| 5,351,212 A | * | 9/1994 | Hashimoto | ............. 365/185.21 |
| 5,805,500 A | * | 9/1998 | Campardo et al. | ........ 365/185.2 |
| 5,973,959 A | * | 10/1999 | Gerna et al. | ........... 365/185.03 |
| 6,191,989 B1 | | 2/2001 | Luk et al. | |
| 6,288,934 B1 | * | 9/2001 | Aikawa | ................. 365/185.03 |
| 6,473,340 B1 | | 10/2002 | Pasotti et al. | |
| 7,116,572 B2 | | 10/2006 | Sun et al. | |

OTHER PUBLICATIONS

European Search Report for EP 04 42 5724 dated Feb. 22, 2005.

* cited by examiner

*Primary Examiner*—Dang T Nguyen
(74) *Attorney, Agent, or Firm*—Schwabe Williamson & Wyatt

(57) ABSTRACT

Described herein is a reading circuit for a nonvolatile memory device, wherein the currents flowing through an array memory cell to be read, and a reference memory cell with known contents, are converted into an array voltage and, respectively, into a reference voltage, which are compared to determine the contents of the array memory cell. The method envisages reducing the electrical stress to which the reference memory cell is subjected during reading, by generating and holding a sample of the reference voltage, then deselecting the reference memory cell, and then continuing reading using the sample of the reference voltage.

29 Claims, 3 Drawing Sheets

READING CIRCUIT AND METHOD FOR A NONVOLATILE MEMORY DEVICE

PRIORITY CLAIM

This continuation application claims priority to U.S. patent application Ser. No. 11/238,137, filed Sep. 28, 2005, now U.S. Pat. No. 7,242,619 which claims priority from European patent application No. 04425724.4, filed Sep. 28, 2004, which is incorporated herein by reference.

TECHNICAL FIELD

The present invention relates generally to a reading circuit and method for a nonvolatile memory device.

BACKGROUND

As is known, a nonvolatile memory device comprises a memory array formed by memory cells arranged in rows and columns, wherein wordlines connect gate terminals of memory cells on the same row, and bitlines connect drain terminals of memory cells on the same column.

Individual rows of the memory array are addressed by a row decoder receiving an encoded address and biasing the wordline of the row each time addressed at a stable and precise voltage, the value of which depends upon the type of operation to be carried out (reading, programming, verifying, erasing), whilst individual columns of the memory array are addressed by a column decoder receiving the same encoded address and biasing the bitline of the column each time addressed at a voltage such as to guarantee that on the drain terminal of the addressed memory cell there is a pre-set electrical potential, which often must be precise, stable, and controlled.

It is also known that in a floating-gate nonvolatile memory cell, storage of a logic value is performed by programming the threshold voltage of the memory cell through the injection of an appropriate amount of electrical charge in the floating-gate region.

According to the information stored, the memory cells are distinguished into erased memory cells (logic value stored "1"), in the floating-gate region of which no electrical charge is stored, and written or programmed memory cells (logic value stored "0"), in the floating-gate region of which an electrical charge is stored that is sufficient to cause an increase in the threshold voltage of the memory cells, the increase being large enough to be sensed.

The most widely used method for reading nonvolatile memory cells envisages comparing a quantity correlated to the current flowing through the array memory cell with a similar quantity correlated to the current flowing through a reference memory cell with known contents.

In particular, to carry out reading of an array memory cell, a read voltage having a value between the threshold voltage of an erased memory cell and that of a written memory cell is supplied to the gate terminal of the memory cell, in such a way that, if the array memory cell is written, the read voltage is lower than its threshold voltage, and hence current does not flow in the array memory cell, whilst, if the memory cell is erased, the read voltage is higher than its threshold voltage, and hence a current flows in the array memory cell.

The reading of an array memory cell is performed by a reading circuit generally known as sense amplifier, which is connected to the bitlines and, in addition to recognition of the logic value stored in the array memory cell to be read, also provides for the correct biasing of the drain terminal of the array memory cell.

A general circuit architecture of a nonvolatile memory device of the type described above is schematically shown in FIG. 1, wherein 1 designates the memory device as a whole, 2 designates the memory array, 3 designates the row decoder, 4 designates the column decoder, 5 designates the reading circuit, and 6 designates a supply stage connected to the row and column decoders 3, 4 and supplying biasing voltages for the wordlines and bitlines of the memory array 2, which are necessary during the various operating steps of the memory device (reading, writing, and erasing).

A common drawback in the memory devices of the type described above is represented by the fact that biasing of a memory cell during reading induces in the memory cell an electrical stress that takes the form of a loss and/or a gain of electrical charge stored in the floating-gate region, with the risk of altering the logic value stored therein.

This danger is particularly felt in the reference memory cell, which is in fact addressed at each reading of the memory array, and consequently an alteration of the electrical charge stored therein could have catastrophic consequences on the reading of the memory array.

The solution currently adopted for overcoming this drawback consists of using a number of reference memory cells, each of which is used during reading of a corresponding portion of the memory array. In this way, the electrical stress induced by biasing is uniformly distributed over the various reference memory cells, and hence each reference memory cell is subjected to an electrical stress reduced by a factor equal to the number of reference memory cells.

As compared to the solution with a single reference memory cell, the solution with a number of reference memory cells involves, on the one hand, a noticeable increase in the occupation of area on the silicon, and, on the other hand, an increase in the programming times of the reference memory cells.

This drawback is then further accentuated in that in actual fact, each reference is not constituted by a single memory cell, but rather by a bank of memory cells arranged in rows and columns, in which just one of the memory cells actually performs the task of reference element during reading, whilst the other memory cells that surround it have only the purpose of reproducing the same environment that surrounds the array memory cell to be read so that its physical structure will become as much as possible similar to that of the array memory cell, thus reducing behavioral differences that can be attributed to lithographic aspects of the process.

SUMMARY

An embodiment of the present invention is a reading circuit and method that will enable the drawbacks of the known art to be overcome.

BRIEF DESCRIPTION OF THE DRAWINGS

For a better understanding of the present invention, there is now described an embodiment, provided purely by way of non-limiting example, with reference to the attached drawings, in which.

DETAILED DESCRIPTION

An idea underlying embodiments of the present invention is to sample and hold a voltage correlated to the current flowing through the reference memory cell in such a way as to be able to deselect the reference memory cell and continue reading of the array memory cell using said sampled and held voltage, thus reducing the electrical stress induced on the reference memory cell.

Figure 2:
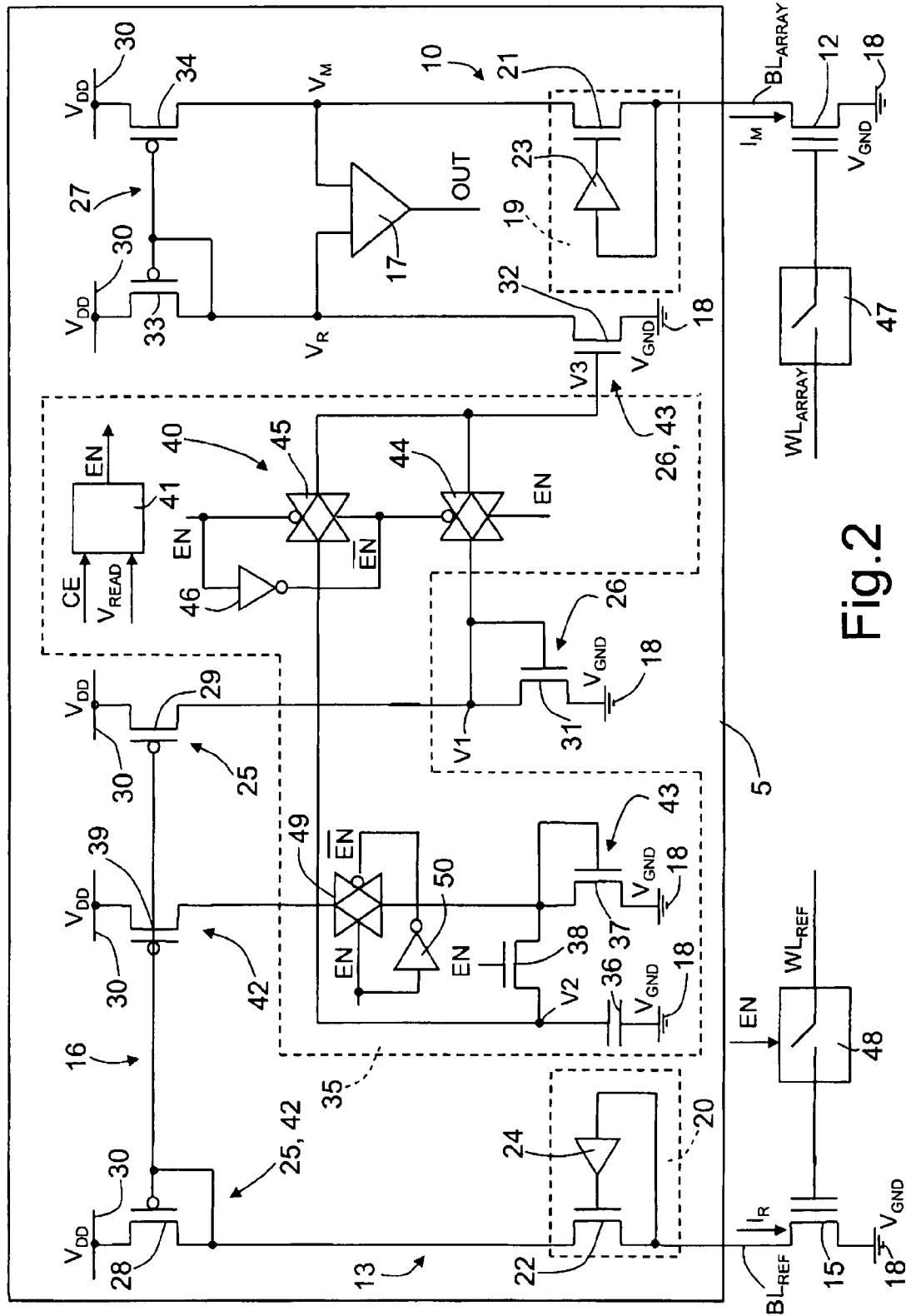
FIG. 2 shows a read circuit according to an embodiment of the present invention.

FIG. 2 illustrates a reading circuit designed to implement the above idea, which is basically formed by a reference branch, by as many array branches as the number of bits to be read simultaneously, by a current/voltage converter stage, by a comparator stage, and by a sample-and-hold stage.

For reasons of simplicity of description and illustration, represented in FIG. 2 is just one array branch, given that all the considerations regarding this branch also apply to all the other array branches.

In particular, as illustrated in FIG. 2, the array branch, designated by 10, is connected, through an array bitline $BL_{ARRAY}$, to an array memory cell 12 the contents of which are to be read; the reference branch, designated by 13, is connected, through a reference bitline $BL_{REF}$, to a reference memory cell 15 the contents of which are known; the current/voltage converter stage, designated by 16, is connected to the array and reference branches 10, 13 to convert the currents $I_M$ and $I_R$ flowing, in use, through the array memory cell 12 and the reference memory cell 15 into an array voltage $V_M$ and, respectively, into a reference voltage $V_R$; and the comparator stage, designated by 17, is connected to the current/voltage converter stage 16 to compare the array voltage $V_M$ and reference voltage $V_R$ and supply an output logic signal OUT indicating the binary information "0" or "1" stored in the array memory cell 12.

In particular, the array memory cell 12 and reference memory cell 15 have gate terminals connected to an array wordline $WL_{ARRAY}$ and, respectively, to a reference wordline $WL_{REF}$, drain terminals connected to the array bitline $BL_{ARRAY}$ and, respectively, to the reference bitline $BL_{REF}$, and source terminals connected to a ground line 18 set at a ground voltage $V_{GND}$.

The array branch 10 and the reference branch 13 comprise an array biasing stage 19 and, respectively, a reference biasing stage 20 having the purpose of biasing at a pre-set potential the drain terminals of the array memory cell 12 and, respectively, the reference memory cell 15.

In particular, the array biasing stage 19 and reference biasing stage 20 each have a cascoded and fedback circuit structure formed by an NMOS transistor 21 and an NMOS transistor 22, respectively, and by a regulator 23 and a regulator 24, respectively, in which the NMOS transistor 21, 22 has a source terminal connected, on the one hand, to the input terminal of the respective regulator 23, 24 and, on the other, to the respective bitline $BL_{ARRAY}$, $BL_{REF}$, a drain terminal connected to the current/voltage converter stage 13, and a gate terminal connected to the output terminal of the respective regulator 23, 24.

The current/voltage converter stage 16 is formed by three cascaded current mirrors 25, 26 and 27 configured to carry out the current/voltage conversion.

In particular, the first current mirror 25 is formed by a first diode-connected PMOS transistor 28 and by a second PMOS transistor 29, which have gate terminals connected together, source terminals connected to a supply line 30 set at a supply voltage $V_{DD}$, and drain terminals connected to the array biasing stage 20 and, respectively, to the second current mirror 26.

The second current mirror 26 is formed by a first diode-connected NMOS transistor 31 and by a second NMOS transistor 32, which have gate terminals connected together through a switch (described in greater detail hereinafter), source terminals connected to the ground line 18, and drain terminals connected to the drain terminal of the PMOS transistor 29 of the first current mirror 25 and, respectively, to the third current mirror 27.

The third current mirror 27 is formed by a first diode-connected PMOS transistor 33 and by a second PMOS transistor 34, which have gate terminals connected together, source terminals connected to the supply line 30, and drain terminals connected to the drain terminal of the NMOS transistor 32 of the second current mirror 26 and, respectively, to the reference biasing stage 19.

The comparator stage 17 has a first input terminal connected to the drain terminal of the PMOS transistor 33 of the third current mirror 27, on which there is present the reference voltage $V_R$, a second terminal connected to the drain terminal of the PMOS transistor 34 of the third current mirror 27, on which there is present the array voltage $V_M$, and an output terminal supplying the aforementioned output signal OUT.

The sample-and-hold stage, designated by 35, is formed by a capacitor 36, a first diode-connected NMOS transistor 37, a second NMOS transistor 38, a PMOS transistor 39, a selector 40, and a refresh timer 41.

In detail, the PMOS transistor 39 has a gate terminal connected to the gate terminal of the PMOS transistor 28 of the first current mirror 25, a source terminal connected to the supply line 30, and a drain terminal connected, through a CMOS controlled switch ("pass gate") 49, described in greater detail hereinafter, to the drain terminal of the NMOS transistor 37, which in turn has a source terminal connected to the ground line 18 and a gate terminal connected to its own drain terminal.

The PMOS transistor 39 is identical to the PMOS transistor 29 of the first current mirror 25 and defines, together with the PMOS transistor 28 of the first current mirror 25, a fourth current mirror 42 identical to the first current mirror 25.

Likewise, the NMOS transistor 37 is identical to the NMOS transistor 31 of the second current mirror 26 and defines, together with the NMOS transistor 32 of the second current mirror 26, a fifth current mirror 43 identical to the second current mirror 26.

The NMOS transistor 38, instead, has a gate terminal receiving a refresh signal EN generated by the refresh timer 41, a drain terminal connected to the drain terminal of the NMOS transistor 37, and a source terminal connected to a first terminal of the capacitor 36, the second terminal of which is connected to the ground line 18.

The CMOS controlled switch 49 is formed by a PMOS transistor and by an NMOS transistor (not illustrated) having drain terminals connected together and defining a first current conduction terminal of the switch 49, source terminals connected together and defining a second current conduction terminal of the switch 49, and gate terminals defining, respectively, a first control terminal and a second control terminal of the switch 49. In particular, the switch 49 receives, on the first control terminal (i.e., the one defined by the gate terminal of the PMOS transistor), a negated refresh signal $\overline{EN}$, generated starting from a refresh signal EN by means of a logic inverter 50, and, on the second control terminal (i.e., the one defined by the gate terminal of the NMOS transistor), the refresh signal EN.

The selector 40 is formed by a first CMOS controlled switch ("pass gate") 44 and by a second CMOS controlled switch ("pass gate") 45, each formed by a PMOS transistor and by an NMOS transistor (not illustrated) having drain terminals connected together and defining a first current conduction terminal of the respective controlled switch 44, 45, source terminals connected together and defining a second current conduction terminal of the respective controlled switch 44, 45, and gate terminals defining, respectively, a first control terminal and a second control terminal of the respective controlled switch 44, 45.

In particular, the first controlled switch 44 is connected between the gate terminals of the NMOS transistors 31, 32 of the second current mirror 26 and receives, on the first control terminal (i.e., the one defined by the gate terminal of the respective PMOS transistor), the negated refresh signal $\overline{EN}$, generated starting from the refresh signal EN by means of a logic inverter 46, and, on the second control terminal (i.e., the one defined by the gate terminal of the respective NMOS transistor), the refresh signal EN.

The second controlled switch 45, instead, is connected between the first terminal of the capacitor 36 and the gate terminal of the NMOS transistor 32 of the second current mirror 26 and receives, on the first control terminal (i.e., the one defined by the gate terminal of the respective PMOS transistor), the refresh signal EN, and, on the second control terminal (i.e., the one defined by the gate terminal of the respective NMOS transistor), the negated refresh signal $\overline{EN}$.

The refresh signal EN is a logic signal switching between a high logic level defined by the supply voltage $V_{DD}$ and a low logic level defined by the ground voltage $V_{GND}$, and is generated by the refresh timer 41 based on a chip enable signal CE and on the read voltage $V_{READ}$ at which the array wordline $WL_{ARRAY}$ and reference wordline $WL_{REF}$ are biased during reading, in the way that will be described in detail in what follows.

Illustrated schematically moreover in FIG. 2 are the parts of the column decoder dedicated to the selection of the array memory cell 12 and reference memory cell 15. In particular, designated by 47 is an array row decoder stage connected to the array wordline $WL_{ARRAY}$, and designated by 48 is a reference row decoder stage connected to the reference wordline $WL_{REF}$ and receiving the refresh signal EN, via which deselection of the reference memory cell 15 is controlled, as will be described in greater detail in what follows.

Operation of the reading circuit 5 will be described hereinafter with reference to FIG. 3, in which the time waveforms of the chip enable signal CE and of the refresh signal EN are shown.

Figure 1:
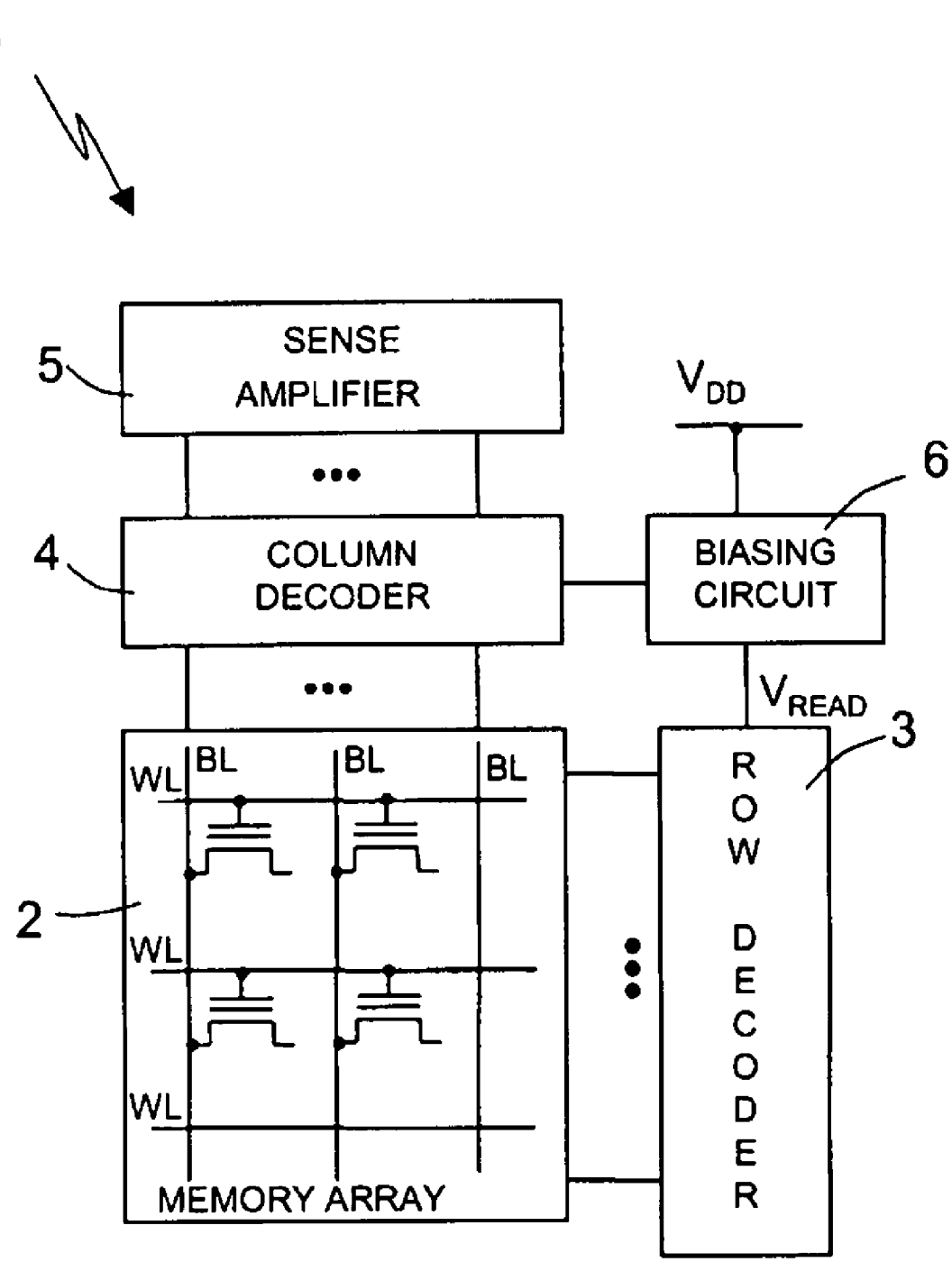
FIG. 1 shows the top-level circuit architecture of a conventional nonvolatile memory device and of a nonvolatile memory device according to an embodiment of the invention.

Reading of the array memory cell 12 starts when the chip enable signal CE switches from a high logic level to a low logic level, switching that determines exit from a stand-by condition, during which the reading circuit 5 is off and the array memory cells 12 and reference memory cells 15 are deselected, i.e., their gate terminals are biased at the ground voltage $V_{GND}$. Upon exit from the stand-by condition, the array memory cells 12 and reference memory cells 15 are selected, i.e., their gate terminals are biased at the read voltage $V_{READ}$, which is typically generated by a booster circuit of the supply stage 6 (FIG. 1) starting from the supply voltage $V_{DD}$.

In this operating condition, the enable signal EN assumes a high logic level, so that the NMOS transistor 38 of the sample-and-hold stage 35 is closed, the controlled switch 44 of the selector 40 is closed, whilst the controlled switch 45 of the selector 40 is open.

Consequently, the capacitor 36 starts to charge through the NMOS transistor 38, and the voltage, designated by $V_3$, on the gate terminal of the NMOS transistor 32 of the second current mirror 26 is equal to the voltage, designated by $V_1$, on the gate terminal of the NMOS transistor 31 of the second current mirror 26.

The current $I_R$ flowing through the reference memory cell 15 is mirrored twice, a first time by the first current mirror 25 and a second time by the second current mirror 26, and, flowing through the PMOS transistor 33 of the third current mirror 27, is converted into the reference voltage $V_R$.

Likewise, flowing through the PMOS transistor 34 of the third current mirror 27, the current $I_M$ flowing through the array memory cell 12 is converted into the array voltage $V_M$.

The logic level assumed by the output signal OUT supplied by the comparator stage 17, indicating the contents of the array memory cell 12, will depend upon which, between the array voltage $V_M$ and reference voltage $V_R$, is the greater.

When a time $T_1$ has elapsed from exit from the stand-by condition sufficient for the voltage, designated by $V_2$, across the capacitor 36 to become equal to the voltage $V_1$ on the gate terminal of the NMOS transistor 31 of the second current mirror 26, the refresh signal EN is switched to the low logic level. Broadly speaking, the time $T_1$ necessary for charging the capacitor 36 and thus generating the sample $(V_2)$ of the voltage $V_1$ corresponds to the time necessary for carrying out reading of one or more array memory cells 12, this depending upon the capacitance of the capacitor 36 and the characteristics of the capacitor charge circuit.

Switching of the refresh signal EN to the low logic level determines opening of the NMOS transistor 38 of the sample-and-hold stage 35, thus interrupting charging of the capacitor 36, opening of the controlled switch 44, and closing of the controlled switch 45.

In addition, switching of the refresh signal EN to the low logic level also determines opening of the controlled switch 49, thus interrupting the current flow through PMOS transistor 39 and NMOS transistor 37 and reducing the overall current consumption of the reading circuit 5, without affecting the functionality of the latter. In actual fact, once the sample V2 of the voltage V1 has been generated and stored in the capacitor 36, the current flowing through PMOS transistor 39 and NMOS transistor 37 becomes useless for this purpose and gives rise only to a undesired current consumption, that may be zeroed by simply opening the switch 49.

Furthermore, in response to switching of the refresh signal EN to the low logic level, the reference row decoder stage 48 deselects the reference memory cell 15; i.e., it biases the reference wordline $WL_{REF}$ to the ground voltage $V_{GND}$.

In this operating condition, the voltage $V_3$ on the gate terminal of the NMOS transistor 32 of the second current mirror 26 becomes equal to the voltage $V_2$ across the capacitor 36, so that reading of the array memory cell 12 continues with the reference memory cell 15 deselected, using precisely the voltage $V_2$ across the capacitor 36. During this step, the reference memory cell 15 is not biased, so that the electrical stress to which it is subjected during the entire reading step is considerably reduced as compared to the case where the reference memory cell 15 is selected for the entire reading.

During the time interval in which reading of the memory array 2 is performed using the voltage $V_2$ across the capacitor 36, there are leakages of electrical charge in the capacitor 36 due to the inevitable presence of the leakage currents, so that it is necessary to carry out a periodic refresh of the charge stored in the capacitor.

Figure 3:
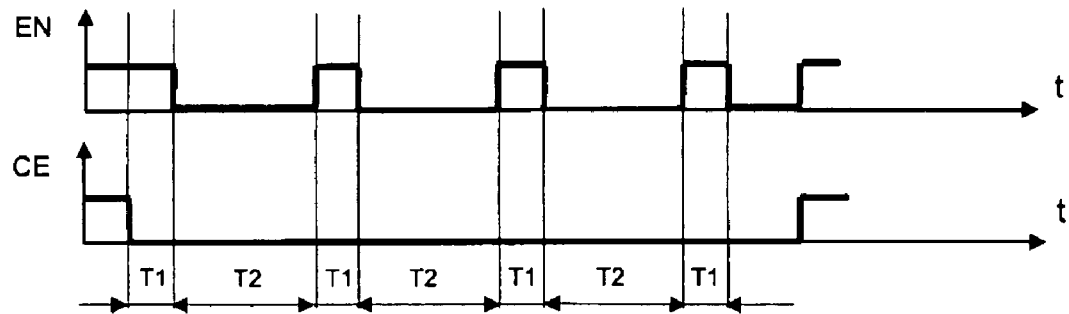
FIGS. 3 and 4 show the time waveforms of some electrical quantities of the read circuit of FIG. 2 according to an embodiment of the invention.

The leakage currents are, in actual fact, very small, and hence discharging of the capacitor 36 occurs very slowly, so that the time interval, designated in FIG. 3 by $T_2$ between the instant in which the refresh signal EN switches to the low logic level, and hence there is interruption of recharging of the capacitor 36, and the instant in which the refresh signal EN again switches to the high logic level to carry out refresh of the capacitor 36 is much greater than the duration $T_1$ of the refresh. Broadly speaking, $T_2$ assumes values such that during said time interval it is possible to carry out several tens of, perhaps even a hundred or more, readings of array memory cells 12.

It may readily be appreciated how the electrical stress induced on the reference memory cell 15 is reduced by a factor equal to $T_2/T_1 > 1$. In order to give an idea of the amount of the reduction of the electrical stress to which the reference memory cell 12 is subjected, it may be considered that reasonable values for $T_1$ and $T_2$ can, for example, be $T_1 \cong 40$ ns and $T_2 \cong 2$ μs, and that hence the electrical stress is reduced by a factor equal to $T_2/T_1 \cong 50$. Furthermore, with the values of $T_1$ and $T_2$ indicated above and assuming that the reading of a memory cell requires approximately 20 ns, the generation of the sample $V_2$ requires a time corresponding to the reading of two memory cells, during which, then, the reference memory cell 15 is on, whilst the sample $V_2$ is used for carrying out reading of the subsequent fifty memory cells, during which the reference memory cell 15 is off.

Another aspect to take into consideration in timing the refresh is the variability of the read voltage $V_{READ}$ applied to the gate terminals of the array memory cell 12 and reference memory cell 15.

In fact, in many applications the nonvolatile memory device, for example a Flash memory, is used in combination with another memory device, for example a RAM or SRAM. In this type of application, the two memory devices share the address bus, and reading of the RAM is performed at a frequency higher than the one used for the Flash memory. Sharing of the address bus means that when the RAM is read, also the Flash memory performs internal addressing cycles (or aborted readings), which can cause a rather marked temporary decrease in the read voltage $V_{READ}$ supplied by the supply stage 6. If, therefore, a reading of the RAM is followed by a reading of the Flash memory, the first readings may be performed with a read voltage $V_{READ}$ smaller than the nominal one. But, whereas in read circuits according to the known art a temporary lowering of the read voltage $V_{READ}$ both on the array branch and on the reference branch does not give rise to any problem in so far as it is seen by the read circuit as a common mode disturbance, in the reading circuit described above in conjunction with FIGS. 2 and 3, the temporary lowering of the read voltage $V_{READ}$ may be a non-negligible problem in so far as, if the read voltage $V_{READ}$ is sampled precisely when the voltage-lowering transient is taking place, in the readings that are performed immediately after said transient, and before the read voltage $V_{READ}$ is again sampled, the read voltage $V_{READ}$ and its sampled value can even be sensed differently, thus falsifying the comparison performed by the comparator stage 17. In a manner altogether equivalent, it could be said that in the particular circumstances described above, it is as if the readings were performed by supplying to the reference memory cell 15 a read voltage higher than the one supplied to the array memory cell 12, with evident adverse repercussions on the correctness of the reading.

This eventuality is remedied by the refresh timer 41, which constantly monitors the read voltage $V_{READ}$ and forces refresh of the capacitor 36 in the case where the read voltage $V_{READ}$ exits from an operating window of pre-set width $\Delta$ centered about the nominal value $V_{READ\_NOM}$, which is assumed during the steady state.

Figure 4:
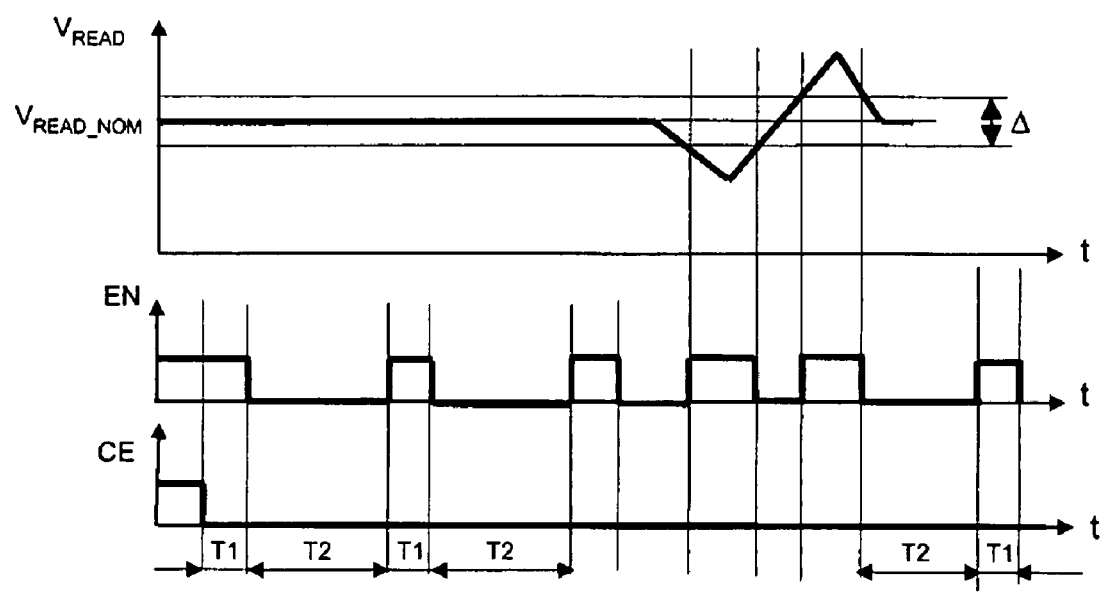

FIG. 4 shows the time waveform of the read voltage $V_{READ}$ supplied by the supply stage 6 immediately after the aborted readings and shows how the waveform of the refresh signal EN supplied by the refresh timer 41 is consequently modified.

As may be noted, in the case where the read voltage $V_{READ}$ exceeds, or drops below, the nominal value $V_{READ\_NOM}$ by a quantity $\Delta/2$, the refresh signal EN is switched to the high logic level, so as to force refresh of the capacitor 36. The refresh signal EN is then brought back again to the low logic level when the read voltage $V_{READ}$ again assumes values within the operating window.

As a result, with an appropriate choice of the sampling period and with control of the read voltage $V_{READ}$, according to the concept expressed above the voltage $V_2$ across the capacitor 36 can be kept at values very close to the voltage $V_1$, with reductions of reading error to negligible levels.

The advantages of the present invention are evident from the above description. In particular, it is emphasized that the present invention is fully effective in reducing the electrical stress to which the reference memory cells are subjected during reading and verifying, thus enabling a marked improvement in the reliability of the memory device.

Finally, it is clear that modifications and variations can be made to what is described and illustrated herein, without thereby departing from the sphere of protection of the present invention, as defined in the annexed claims.

For example, it should be emphasized that the principle underlying the present invention can be applied both to traditional memory cells capable of storing just one bit (i.e., two-level cells) and to memory cells capable of storing a number of bits (multilevel cells).

What is claimed is:

1. A read circuit for reading a data-storage memory cell, the read circuit comprising:
   a reference stage operable during a first period to generate a reference signal from a reference memory cell and operable during a second period to generate the reference signal from a stored quantity;
   a read stage operable to generate a read signal from the data-storage memory cell; and
   an output stage operable to generate from the reference and read signals an output signal having a value that is related to the value of data stored in the data-storage memory cell.

2. The read circuit of claim 1 wherein the stored quantity comprises a stored signal.

3. The read circuit of claim 1 wherein the reference stage is operable:
   during the first period to generate an intermediate signal from the reference memory cell and to generate the reference signal from the intermediate signal; and
   during the second period to store the intermediate signal and to generate the stored quantity from the intermediate signal.

4. The read circuit of claim 1 wherein the reference stage is operable:
   during the first period to generate an intermediate signal from the reference memory cell and to generate the reference signal from the intermediate signal; and
   during the second period to store the intermediate signal and to generate the stored quantity equal to the stored intermediate signal.

5. The read circuit of claim 1 wherein the reference stage is operable:

during the first period to generate a voltage from the reference memory cell and to generate the reference signal from the voltage; and during the second period to hold the voltage and to generate the stored quantity equal to the held voltage.

6. The read circuit of claim 1 wherein the reference stage comprises:
a first branch operable to generate a reference current from the reference memory cell during the first period;
a mirror circuit operable to mirror the reference current and to generate a voltage from the mirrored current during the first period;
a hold circuit operable to store the voltage during the second period;
a second branch operable to generate the reference signal from the generated voltage during the first period and from the stored voltage during the second period.

7. The read circuit of claim 1 wherein the reference stage comprises:
a first branch operable to generate a reference current from the reference memory cell during the first period;
a mirror circuit operable to mirror the reference current and to generate a voltage from the mirrored current during the first period;
a hold circuit operable to store substantially the voltage during the second period;
a coupling circuit having a node and operable to couple the generated voltage to the node during the first period and operable to couple the stored voltage to the node during the second period; and
a second branch operable to generate the reference signal from the voltage on the node.

8. The read circuit of claim 1 wherein the reference stage comprises:
a first branch operable to generate a reference current from the reference memory cell during the first period;
a second branch operable to generate a first mirror current in response to the reference current and to generate a first voltage from the first mirror current during the first period;
a third branch operable to generate a second mirror current in response to the reference current and to generate a second voltage from the second mirror current during the first period;
a hold circuit operable to store the one of the first and second voltages during the second period; and
a fourth branch operable to generate the reference signal from the stored voltage during the second period and from the unstored one of the first and second voltages during the first period.

9. The read circuit of claim 1 wherein the read stage comprises a branch coupled to the reference stage and operable to be coupled to the data-storage memory cell.

10. The read circuit of claim 1 wherein the output stage comprises a comparator operable to generate the output signal in response to a comparison of the reference and read signals.

11. The read circuit of claim 1 wherein the reference stage is operable during a third period to generate the reference signal from the reference memory cell and operable during a fourth period to generate the reference signal from the stored quantity.

12. The read circuit of claim 1 wherein the reference stage is operable to refresh the stored quantity.

13. The read circuit of claim 1 wherein the reference stage is operable to refresh the stored quantity in response to a signal being outside of a range.

14. The read circuit of claim 1 wherein the reference stage is operable:
to generate the stored quantity from a stored voltage; and
to refresh the stored voltage.

15. The read circuit of claim 1 wherein the reference stage:
comprises a capacitor operable to store a voltage;
is operable to generate the stored quantity from the stored voltage; and
is operable to refresh the capacitor.

16. An integrated circuit, comprising:
a data-storage memory cell;
a reference memory cell;
a reference stage operable during a first period to generate a reference signal from the reference memory cell and operable during a second period to generate the reference signal from a stored quantity;
a read stage operable to generate a data signal from the data-storage memory cell; and
an output stage operable to generate from the reference and read signals an output signal having a value that is related to the value of data stored in the data-storage memory cell.

17. The integrated circuit of claim 16 wherein the data-storage and reference memory cells comprise respective non-volatile memory cells.

18. A system, comprising:
a first integrated circuit, comprising
a data-storage memory cell,
a reference memory cell,
a reference stage operable during a first period to generate a reference signal from the reference memory cell and operable during a second period to generate the reference signal from a stored quantity,
a read stage operable to generate a data signal from the data-storage memory cell, and
an output stage operable to generate from the reference and read signals an output signal having a value that is related to the value of data stored in the data-storage memory cell; and
a second integrated circuit coupled to the first integrated circuit.

19. The system of claim 18 wherein the first and second integrated circuits are disposed on a same die.

20. The system of claim 18 wherein the first and second integrated circuits are disposed on respective dies.

21. The system of claim 18 wherein the second integrated circuit comprises a controller.

22. A method, comprising:
generating an intermediate signal from a reference memory cell;
storing a quantity related to the intermediate signal;
generating a reference signal from the stored quantity;
generating a read signal from data stored in a data-storage memory cell; and
generating an output signal related to the data in response to the reference and read signals.

23. The method of claim 22 wherein generating the intermediate signal comprises:
generating a current with the reference memory cell;
mirroring the current;
generating a voltage with the mirrored current; and
wherein the intermediate signal comprises the voltage.

24. The method of claim 22 wherein storing a quantity related to the intermediate signal comprises storing the voltage.

25. The method of claim 22 wherein storing a quantity related to the intermediate signal comprises storing the intermediate signal.

26. The method of claim 22 wherein generating a reference signal from the stored quantity comprises:
generating a reference current from the stored quantity;
generating a reference voltage in response to the reference current; and
wherein the reference signal comprises the reference voltage.

27. The method of claim 22 wherein generating an output signal comprises:
comparing the reference signal to the read signal;
generating the output signal having a first logic level if the reference signal is greater than the read signal; and
generating the output signal having a second logic level if the reference signal is less than the read signal.

28. The method of claim 22, further comprising refreshing the stored quantity.

29. The method of claim 22, further comprising refreshing the stored quantity in response to the stored quantity being outside of a range.

* * * * *

UNITED STATES PATENT AND TRADEMARK OFFICE
CERTIFICATE OF CORRECTION

PATENT NO. : 7,450,428 B2 Page 1 of 1
APPLICATION NO. : 11/811394
DATED : November 11, 2008
INVENTOR(S) : Ignazio Martines It is certified that error appears in the above-identified patent and that said Letters Patent is hereby corrected as shown below:

Col. 9, lines 13-14 [Claim 6] "...a hold circuit ...the second period;"..." should read --...a hold circuit...the second period; and...--;

Signed and Sealed this

Twenty-fourth Day of March, 2009

JOHN DOLL
*Acting Director of the United States Patent and Trademark Office*